United States Patent
Glas

(10) Patent No.: US 6,546,237 B1
(45) Date of Patent: Apr. 8, 2003

(54) DIFFERENTIAL FM DETECTOR FOR RADIO RECEIVERS

(75) Inventor: Jack P. F. Glas, Basking Ridge, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/386,587

(22) Filed: Aug. 31, 1999

(51) Int. Cl.⁷ .............................. H04B 1/26; H04B 1/16

(52) U.S. Cl. .................... 455/324; 455/210; 455/214; 455/242.2; 329/321; 329/304; 375/331; 375/340

(58) Field of Search ................. 455/205, 210, 455/214, 242.2, 324, 326, 336–337; 329/318, 321, 353, 304; 375/324, 325, 329, 330, 331, 332, 340, 346, 348, 350, 344–345, 355

(56) References Cited

U.S. PATENT DOCUMENTS

| | | | |
|---|---|---|---|
| 4,054,840 A | 10/1977 | Sato | |
| 4,634,989 A | 1/1987 | Mehrgardt | |
| 4,750,214 A | 6/1988 | Hart et al. | |
| 4,852,090 A | * 7/1989 | Borth | 370/347 |
| 4,878,029 A | * 10/1989 | Saulnier et al. | 329/304 |
| 5,052,050 A | * 9/1991 | Collier et al. | 455/326 |
| 5,291,523 A | * 3/1994 | Bergmans et al. | 375/14 |
| 5,828,955 A | * 10/1998 | Kipowski et al. | 455/324 |
| 5,910,968 A | * 6/1999 | Chouly et al. | 375/279 |
| 6,055,282 A | * 4/2000 | Hughes et al. | 375/340 |
| 6,072,997 A | * 6/2000 | Kawai | 455/214 |
| 6,127,884 A | * 10/2000 | Rishi | 329/304 |
| 6,175,726 B1 | * 1/2001 | Sydon | 455/337 |
| 6,304,136 B1 | * 10/2001 | Rabii | 375/324 |

OTHER PUBLICATIONS

Marvin K. Simon et al., Differential Versus Limiter–Discriminator Detection of Narrow–Band FM, IEEE Transactions On Communications, vol. COM–31, No. 11, Nov. 1983, pp. 1227–1234.

* cited by examiner

Primary Examiner—William Trost
Assistant Examiner—Simon Nguyen
(74) Attorney, Agent, or Firm—Thomas Stafford

(57) ABSTRACT

A differential FM detection of signals uses in-phase and quadrature phase signal components of a received signal in the detection process, wherein the in-phase and quadrature phase signal components are at a low intermediate frequency (IF). The in-phase and quadrature phase signal components are each amplitude limited, sampled at a prescribed sampling rate and filtered in a prescribed manner. Delayed versions of the filtered in-phase and quadrature phase signal components are generated and, then, signal products are generated of the delayed in-phase signal component and quadrature phase signal component, and the delayed quadrature phase signal component and in-phase signal component. The algebraic difference of the generated signal products is obtained to yield the desired data signal, e.g., symbols. Specifically, a FIR (finite impulse response) filter is employed to filter the limited and sampled versions of the in-phase and quadrature phase signal components to alleviate the interference caused by the limiter. In an embodiment of the invention, the detector is a differential Continuous Phase Frequency Shift Keyed (CPFSK) FM detector. In a GFSK differential FM detector, employing a post detection compensation arrangement significantly reduces distortion caused by ISI. Specifically, the absolute value of the detected data signal is obtained and compared to a prescribed threshold value. If the threshold is exceeded no compensation is required. However, if the threshold is not exceeded, it is assumed that prescribed data symbol transitions have occurred and that the currently received data symbol is the inverse of the last preceding detected data symbol. Consequently, the current data symbol is replaced by the inverse of the preceding data symbol.

28 Claims, 2 Drawing Sheets

100

200

DIFFERENTIAL FM DETECTOR FOR RADIO RECEIVERS

TECHNICAL FIELD

This invention relates to frequency modulation (FM) detectors and, more particularly, to FM detectors for radio receivers.

BACKGROUND OF THE INVENTION

There are a significant number of prior FM detector arrangements known in the art. Indeed, binary differential detection of FM signals has been recognized as a very desirable technique for recovering FM data signals in radio receivers. Heretofore, such differential detectors have employed super heterodyne techniques for obtaining the necessary intermediate frequency. A serious limitation of super heterodyne detectors is that they can not be implemented totally in integrated from. This is because required image-reject and channel select filters would necessarily be implemented off the integrated circuit chip including the other receiver circuitry.

One attempt at overcoming the limitations of the super heterodyne detector approach is described in U.S. Pat. No. 4,750,214 issued Jun. 7, 1988. In the disclosed arrangement FM signals are demodulated by first converting the FM signal using an analog-to-digital (A/D) converter. Then, a quadrature mixing arrangement is used to obtain the base band in-phase and quadrature phase components of the received data signal. Then, the in-phase and quadrature phase signal components are delayed by a sample interval and cross-products of both the delayed in-phase component and quadrature phase signal component, and the delayed quadrature phase signal component and the in-phase signal component are obtained. The algebraic difference of these signal products is obtained which yields the desired data output signal y.

There a number of problems with the prior differential FM detector arrangements employing the super heterodyne techniques when attempting to apply them to low intermediate frequency (IF) radio receivers. Specifically, generation of a phase shift of $\pi/2$ over the whole signal band is problematic at low IF frequencies. Because of the lower IF frequency, double frequency terms that result in differential FM detectors cannot adequately be removed and, consequently, cause a degradation of the detector performance. Additionally, if a received signal is merely limited before it is supplied to the detector, the resulting harmonics are now located closely and also cause interference. Furthermore, implementing analog delay units for use at a relatively low frequency is also problematic.

Moreover, in GFSK (Gaussian Frequency Shift Keyed) data detectors spreading of a data symbol in time over less than two (2) symbol periods causes intersymbol interference (ISI). This interference has an undesirable negative effect on the BER (bit error rate) performance of the detector.

SUMMARY OF THE INVENTION

These and other problems and limitations of prior known arrangements for differential FM detection of signals are realized in a differential FM detector that uses in-phase and quadrature phase signal components of a received signal, wherein the in-phase and quadrature phase signal components are at a low intermediate frequency (IF). Both the in-phase and quadrature phase signal components are amplitude limited, sampled at a prescribed sampling rate and filtered in a prescribed manner. Delayed versions of the filtered in-phase and quadrature phase signal components are generated and, then, signal products are generated of the delayed in-phase signal component and quadrature phase signal component, and the delayed quadrature phase signal component and in-phase signal component. The algebraic difference of the generated signal products is obtained to yield the desired data signal, e.g., symbols.

Specifically, a FIR (finite impulse response) filter is employed to filter the limited and sampled versions of the in-phase and quadrature phase signal components to alleviate the interference caused by the limiter.

In an embodiment of the invention, the detector is a differential Continuous Phase Frequency Shift Keyed (CPFSK) FM detector.

In a GFSK differential FM detector, employing a post detection compensation arrangement significantly reduces distortion caused by ISI. Specifically, the absolute value of the detected data signal is obtained and compared to a prescribed threshold value. If the threshold is exceeded no compensation is required. However, if the threshold is not exceeded, it is assumed that prescribed data symbol transitions have occurred and that the currently received data symbol is the inverse of the last preceding detected data signal. Consequently, the current data symbol is replaced by the inverse of the preceding data symbol.

DETAILED DESCRIPTION

Figure 1:
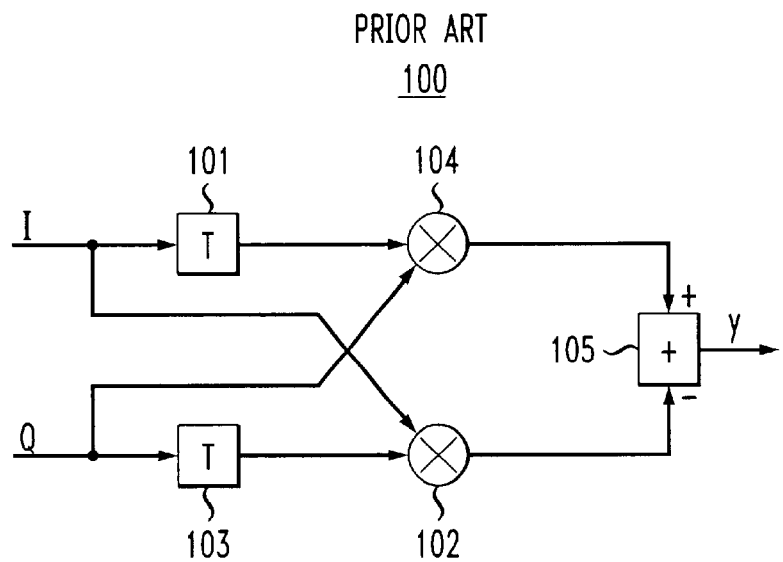
FIG. 1 shows, in simplified block diagram form, a prior art differential FM detector useful in describing the invention.

FIG. 1 shows, in simplified block diagram form, a prior art differential FM detector 100 useful in describing the invention. Specifically, shown is an in-phase (I) signal component being supplied to delay unit (T) 101 and an input of multiplier 102. Similarly, a quadrature phase (Q) signal component is supplied to delay unit (T) 103 and an input of multiplier 104. A delayed version of the I signal component is also supplied to another input of multiplier 104, which yields the product of Q signal component and the delayed version of the I signal component. In this example, the delay interval of delay units 101 and 103 is one symbol interval. The resulting signal product is supplied to the positive input of algebraic difference unit 105. A delayed version of the Q signal component is also supplied to another input of multiplier 102, which yields the product of I signal component and the delayed version of the Q signal component. This resulting signal product is supplied to the negative input of algebraic difference unit 105. An output from algebraic difference unit 105 is the desired data signal, e.g., symbols (y).

Figure 2:
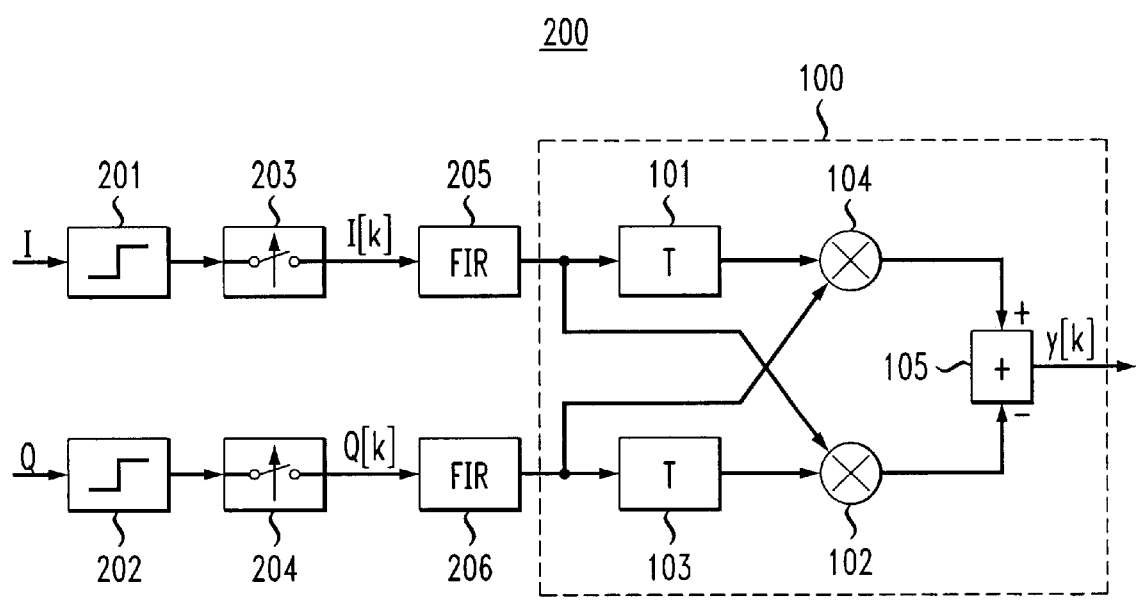
FIG. 2 shows, in simplified block diagram form, a differential FM detector including an embodiment of the invention.

FIG. 2 shows, in simplified block diagram form, a differential FM detector including an embodiment of the invention. Specifically, shown is differential FM detector 100. Detector 100 is essentially identical to that shown in FIG. 1 and explained above. The difference being that the detector 100 is implemented in digital form and yields symbols y(k). Consequently, the elements of detector 100 have being similarly numbered as the elements in FIG. 1 and will not be again discussed in detail. In order to reduce the cost and minimize problems of the prior differential FM detectors, the I and Q analog input signal components are each limited via limiters 201 and 202, sampled via samplers 203 and 204 and, then, filtered via filters 205 and 206, respectively. Thus, the inputs to detector 100 are filtered version of the outputs of samplers 203 and 204, namely, I(k) and Q(k), respectively. The limiting of the I and Q signal components via limiters 203 and 204, respectively, avoids the need for employing analog-to-digital converters. However, use of limiters causes a multitude of harmonics, which cause interference and deteriorate the detector performance. Additionally, the use of samplers 205 and 206 allows implementing the delay units 101 and 103 digitally, thereby avoiding use of analog delay units and their implementation problems. The use of filters 205 and 206 solves the harmonic and interference problems. Thus, the bandwidth of each of FIR filters 205 and 206 is in prescribed relationship to the IF and the frequency of the harmonics generated by limiters 201 and 202. It is noted that the sampling rate is also related to the data rate of the signal channels in the received data signal.

In this example, filters 205 and 206 are each FIR (finite impulse response) filters.

It should be noted that since the I and Q signal components are limited, multipliers (not shown) in the FIR filters 205 and 206 can be replaced by simple sum/difference circuits. Indeed, limiting the number of bits to one (1) that are employed in them can significantly reduce the complexity of multipliers 102 and 104.

It should be noted that the "low" intermediate (IF) frequency is relative to the frequency of the lowest frequency channel in the received signal. That is, an IF that is less than the channel frequency spacing of the communication system in which the detector is being employed in. Furthermore, it is essential that the in-phase and quadrature phase signal components be at the low IF. Indeed, if the in-phase and quadrature phase signal components were located around DC, the harmonics caused by limiters 201 and 203 are too close to effectively filter them out.

In one example, not to be construed as limiting the scope of the invention the modulation format is CPFSK (h=0.28–0.50), data rate is 1 Mbps, low-IF frequency is 500 kHz, sampling rate is 16 MHz, the order of the FIR filters 205 and 206 is 32 with a band width of 650 kHz, and the number of bits employed per symbol after FIR filters 205 an 206 is 8. Note h is the modulation index. It also will be apparent that these values will vary depending on the specific application and the implementers needs.

Figure 3:
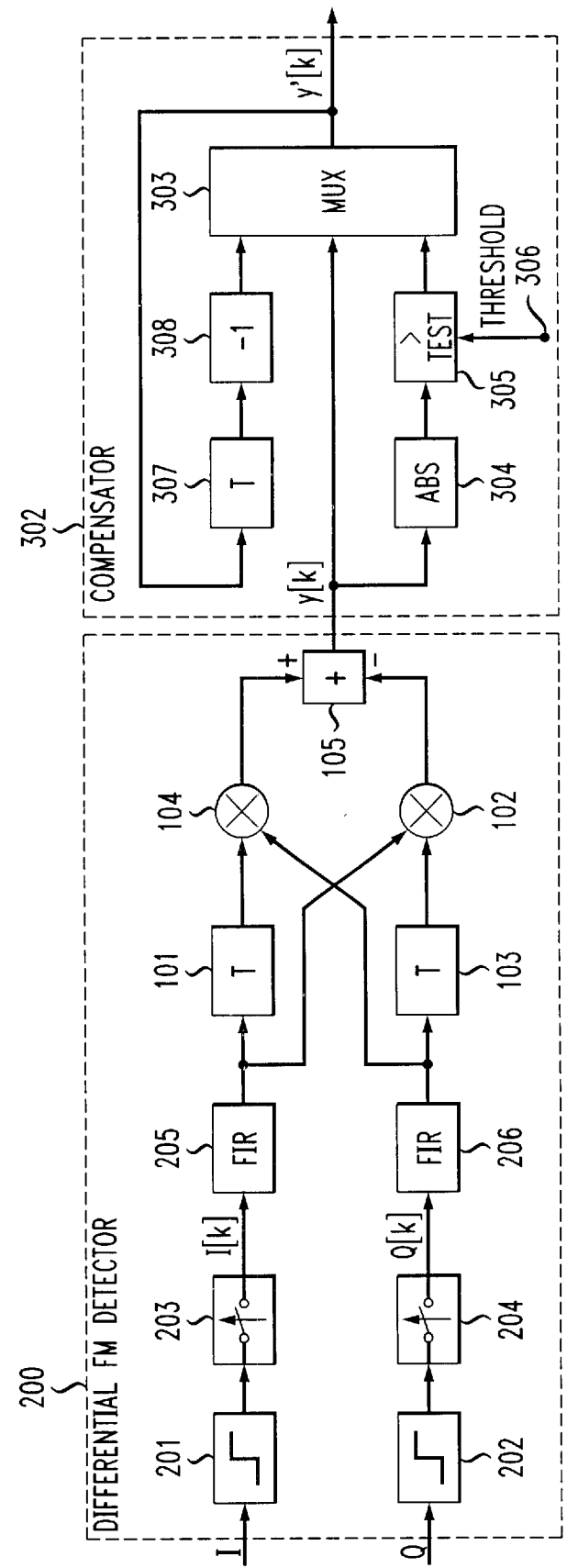
FIG. 3 shows, in simplified block diagram form, a differential FM detector including another embodiment of the invention.

FIG. 3 shows, in simplified block diagram form, a differential FM detector including another embodiment of the invention intended to be employed in GFSK receivers. As is known, a possible way to decrease spectral occupancy while maintaining the signal data rate constant is to apply filtering of the signal frequency representation before transmission. When Gaussian filtering is used, the resulting modulation format is Gaussian Frequency Shift Keyed (GFSK). In such an arrangement the band-width-time product defines the amount of filtering that has been applied.

In one system the modulation format is GFSK with a bandwidth-time product of 0.5. This results in a "spreading" of a symbol in time over just less than two (2) symbol intervals and as such causes intersymbol interference (ISI). The ISI has a negative effect on the system bit error rate (BER).

I have determined that the influence of ISI only plays a significant role in relationship to certain data sequences. For example for data sequences of 1-1-1 or 0-0-0 ISI has a positive effect on the detection probability. Indeed, the final detection variable for these data sequences is of a larger amplitude. However, for data sequences 1-0-1 or 0-1-0, the "middle" data symbol will be severely distorted by both the prior symbol and the later symbol in the sequence. Consequently, it is highly likely that most errors would occur during the transitions from 1 to 0 and 0 to 1 in the 1-0-1 and 0-1-0 data symbol sequences.

Compensator 302 of FIG. 3 takes advantage of this information as described below.

Thus, GFSK data detector 300 shown in FIG. 3 includes differential FM detector 200 (FIG. 2) and compensator 302. In this example, detector 200 is identical to detector 200 of FIG. 2 and its elements have been similarly numbers as those shown in FIG. 2 and described above and will not be discussed further here. The output y(k) from detector 200 is supplied as an input to compensator 302 and, therein, to an input of multiplexer (MUX) 303 and to absolute value (ABS) unit 304. The output of MUX 303 is y'(k) and is supplied to delay (T) unit 307 where it is delayed one (1) symbol interval. The delayed data symbol y'(k) is inverted via inverter (−1) 308, and the inverted symbol is supplied to a second input of MUX 303. Note that inverter 308 adjusts the state of the delayed data symbol such that a logical 1 is adjusted to be a logical 0 and vice versa, i.e., inverts a logical 1 to a logical 0 and a logical 0 to a logical 1. In this example, the logical 1 data symbol is represented by +1 and −1 represents the logical 0 data symbol. As such, the symbol supplied to the second input of MUX 303 represents a state-adjusted version of the last prior symbol in the 1-0-1 and 0-1-0 symbol sequences. Note that, in this example, MUX 303 is operating essentially as a selector. The absolute value of y(k) is supplied to test unit 305 where it is compared to a prescribed threshold value supplied via 306.

Operation of compensator 302 is such that when the threshold is exceeded, an output from test unit 305 causes MUX 303 to select y(k) as its output y'(k). When the threshold is not exceeded, an output from test unit 305 causes MUX 303 to select the delayed version of y'(k) as its output. That is, when the threshold in test unit 305 is not exceeded, the inverted version of the last prior symbol is selected as the MUX 303 output y'(k).

Indeed, the post detection compensation used in this embodiment of the invention can be considered a simple equalizer.

In one example, not to be construed as limiting the scope of the invention the modulation format is GFSK with a modulation index h=0.28, GFSK modulation BT=0.5, data rate is 1 Mbps, low-IF frequency is 500 kHz, sampling rate is 13 MHz, the order and accuracy coefficients of the FIR filters 205 and 206 are 32 and 6 bits, respectively, with a band width of 700 kHz and the number of bits employed per symbol after FIR filters 205 an 206 is 8. It will be apparent that these values will vary depending on the specific application and the implementers needs.

The above-described apparatus is, of course, merely illustrative of the principles of the invention. Indeed, a number other arrangements may be devised by those skilled in the art without departing from the spirit and scope of the invention. For example, embodiments of the invention may be implemented in hardware or in software in a digital signal processor or the like.

What is claimed is:

1. A differential FM detector for use in a receiver in which in-phase (I) and quadrature phase (Q) signal components of a received signal in a prescribed modulation format are available comprising:

a first limiter for limiting the amplitude of said I signal component to yield a limited version of said I signal component;

a second limiter for limiting the amplitude of said Q signal component to yield a limited Q signal component;

a first sampler for sampling at a prescribed sampling rate the limited I signal component to obtain a limited and sampled version of said I signal component;

a second sampler for sampling at said prescribed sampling rate the limited Q signal component to obtain a limited and sampled version of said Q signal component;

a first filter having a prescribed characteristic for filtering said limited and sampled version of said I signal component to yield a filtered version of said limited and sampled I signal component;

a second filter having said prescribed characteristic for filtering said limited and sampled version of said Q signal component to yield a filtered version of said and sampled Q signal component;

a first delay unit for delaying said fillered version of said limited and sampled I signal component by a prescribed interval;

a second delay unit for delaying said filtered version of said limited and sampled Q signal component by said prescribed interval;

a first multiplier supplied with said filtered version of said limited and sampled I signal component and an output from said second delay unit for generating a first product signal;

a second multiplier supplied with said filtered version of said limited and sampled Q signal component and an output from said first delay unit for generating a second product signal; and an algebraic difference unit supplied with said first and second product signals for generating an output data signal representative of the algebraic difference of said second product signal and said first product signal, whereby harmonics and interference caused by said first and second limiters and said first and second samplers is significantly reduced and thereby reducing the detector bit error rate.

2. The invention as defined in claim 1 wherein said prescribed modulation format is continuous phase frequency shift keyed (CPFSK).

3. The invention as defined in claim 1 wherein each of said first and second filters is a finite impulse response (FIR) filter.

4. The invention as defined in claim 3 wherein said receiver is a radio receiver having a low intermediate frequency (IF) and wherein said low intermediate frequency is in prescribed relationship to the frequency of the lowest frequency channel in said received signal.

5. The invention as defined in claim 4 wherein in-phase and quadrature phase signal components are at said low IF.

6. The invention as defined in claim 5 wherein each of said first and second finite impulse response filters has a band width is in prescribed relationship to said intermediate frequency and frequencies of harmonics generated by said first and second limiters.

7. The invention as defined in claim 6 wherein said sampling rate is in prescribed relationship to the data rate of the received signal channel.

8. The invention as defined in claim 7 wherein said prescribed sampling rate is in prescribed relation of the data rate of channels in said received signal.

9. The invention as defined in claim 8 wherein said intermediate frequency is approximately 500 kHz.

10. The invention as defined in claim 9 wherein said bandwidth of each of said FIR filters is approximately 650 kHz.

11. The invention as defined in claim 10 wherein the order of each of said FIR filters is 32.

12. The invention as defined in claim 8 wherein said channel data rate is approximately 1 Mbps and said prescribed sampling rate is approximately 16 MHz.

13. A signal detector for use in a receiver in which in-phase (I) and quadrature phase (Q) signal components of a received signal in a prescribed modulation format are available comprising;

a differential FM detector supplied with said I signal component and said Q signal component for detecting an incoming data signal;

a compensator supplied with said detected data signal for controllable adjusting states of symbols of said detected data signal including supplying as an output a current symbol value of symbol y(k) or an inverted version of a last prior symbol value of symbol y(k) in accordance with prescribed criteria, said compensator including a test unit for determining when there is a logical 0-1-0 or 1-0-1 symbol transition, and an output unit responsive to an output from said test unit for supplying as an output the current symbol value of symbol y(k) or an inverted version of the last prior symbol value of symbol y(k) in accordance with prescribed criteria, whereby intersymbol interference (ISI) is compensated.

14. The invention as defined in claim 13 wherein said modulation format is a Gaussian Frequency Shift Keyed (GFSK) modulation format.

15. The invention as defined by claim 13 wherein said test unit includes an absolute value unit for obtaining the absolute value of the current symbol value of y(k), and a comparator supplied with said absolute value and a prescribed threshold value for determining whether or not a prescribed relationship exists between said absolute value and said prescribed threshold value.

16. The invention as defined in claim 15 wherein said output unit includes a selector responsive to an output from said comparator for controllably selecting as an output the current symbol value of y(k) or an inverted version of the last prior symbol value supplied as an output from said selector.

17. The invention as defined in claim 16 wherein said output unit further includes a delay unit supplied with said output from said selector for delaying it one symbol interval and an inverter for inverting a delayed output from said delay unit, an output from said inverter being said inverted version of the last prior symbol value supplied as an output from said selector, said output from said inverter being supplied as an input to said selector.

18. The invention as defined in claim 17 wherein said prescribed criteria includes when said absolute value exceeds a prescribed relationship of said prescribed threshold value the current symbol value of y(k) is selected by said selector unit as an output and when said absolute value does not exceed said prescribed relationship of said prescribed threshold value said output from said inverter is selected by said selector unit as an output.

19. The invention as defined in claim 13 herein said received signal has one or more frequency channels with one of the frequency channels being a lowest frequency channel in said prescribed modulation format, said receiver is a radio receiver having a low intermediate frequency (IF) and said low intermediate frequency is in prescribed relationship to the frequency of the lowest frequency channel in said received signal, whereby intersymbol interference (ISI) is compensated.

20. The invention as defined in claim 19 wherein said in-phase and quadrature phase signal components are at said low IF.

21. The invention as defined in claim 20, wherein said differential FM detector includes a first limiter for limiting the amplitude of said I signal component to yield a limited I signal component, a second limiter for limiting the amplitude of said Q signal component to yield a limited Q signal component, a first sampler for sampling at a prescribed sampling rate the limited I signal component to obtain a limited and sampled version of said I signal component, a second sampler for sampling at said prescribed sampling rate the limited Q signal component to obtain a limited and sampled version of said Q signal component, a first filter having a prescribed characteristic for filtering said limited and sampled version of said I signal component to yield a filtered version of said limited and sampled I signal component, a second filter having said prescribed characteristic for filtering said limited and sampled version of said Q signal component to yield a filtered version of said limited and sampled Q signal component, a first delay unit for delaying said filtered version of said limited and sampled I signal component by a prescribed interval, a second delay unit for delaying said filtered version of said limited and sampled Q signal component by said prescribed interval, a first multiplier supplied with said filtered version of said limited and sampled I signal component and an output from said second delay unit for generating a first product signal, a second multiplier supplied with said filtered version of said limited and sampled Q signal component and an output from said first delay unit for generating a second product signal and an algebraic difference unit supplied with said first and second product signals for generating an output data signal representative of the algebraic difference of said second product signal and said first product signal, whereby harmonics and interference caused by said first and second limiters and said first and second samplers is significantly reduced and thereby reducing the detector bit error rate.

22. The invention as defined in claim 21 wherein said first and second filters are finite impulse response (FIR) filters.

23. signal detector for use in a receiver for receiving a received FM signal in a prescribed modulation format comprising:

detector means supplied with a received FM signal for differential FM detecting an incoming data signal to yield a detected output data signal y(k);

compensator means supplied with said detected data signal y(k) for controllable adjusting states of symbols of said detected data signal including supplying as an output a current symbol value of symbol y(k) or an inverted version of a last prior symbol value of symbol y(k) in accordance with prescribed criteria, said compensator means including test means for determining when there is a logical 0-1-0 or 1-0-1 symbol transition, and output means responsive to an output from said test unit for supplying as an output the current symbol value of symbol y(k) or an inverted version of the last prior symbol value of symbol y(k) in accordance with said prescribed criteria, whereby intersymbol interference (ISI) is compensated.

24. The invention as defined in claim 23 wherein said modulation format is a Gaussian Frequency Shift Keyed (GFSK) modulation format.

25. The invention as defined by claim 23 wherein said test means includes an absolute value means for obtaining the absolute value of the current symbol value of y(k), and comparator means supplied with said absolute value and a prescribed threshold value for determining whether or not a prescribed relationship exists between said absolute value and said prescribed threshold value.

26. The invention as defined in claim 25 wherein said output means includes selector means responsive to an output from said comparator means for controllably selecting as an output the current symbol value of y(k) or an inverted version of the last prior symbol value supplied as an output from said selector means.

27. The invention as defined in claim 26 wherein said output means further includes a delay means for delaying said output from said selector means one symbol interval and inverter means for inverting a delayed output from said delay means, an output from said inverter means being said inverted version of the last prior symbol value supplied as an output from said selector means, said output from said inverter means being supplied as an input to said selector means.

28. The invention as defined in claim 27 wherein said prescribed criteria includes when said absolute value exceeds a prescribed relationship of said prescribed threshold value the current symbol value of y(k) is selected by said selector means as an output and when said absolute value does not exceed said prescribed relationship of said prescribed threshold value said output from said inverter means is selected by said selector means as an output.

* * * * *